United States Patent
Cecil, Jr.

(10) Patent No.: US 9,684,297 B2
(45) Date of Patent: Jun. 20, 2017

(54) SYSTEM AND METHOD FOR DOUBLE ROTATION OPTIMIZATION

(71) Applicant: Robert Cecil, Jr., Sherwood, OR (US)

(72) Inventor: Robert Cecil, Jr., Sherwood, OR (US)

(*) Notice: Subject to any disclaimer, the term of this patent is extended or adjusted under 35 U.S.C. 154(b) by 450 days.

(21) Appl. No.: 14/283,180

(22) Filed: May 20, 2014

(65) Prior Publication Data
US 2014/0343708 A1    Nov. 20, 2014

Related U.S. Application Data (60) Provisional application No. 61/825,371, filed on May 20, 2013.

(51) Int. Cl.
*G05B 19/18*   (2006.01)
*G06F 17/50*   (2006.01)

(52) U.S. Cl.
CPC .......... *G05B 19/182* (2013.01); *G06F 17/50* (2013.01); *G05B 2219/32105* (2013.01); *G05B 2219/50149* (2013.01)

(58) Field of Classification Search
None
See application file for complete search history.

(56) References Cited

U.S. PATENT DOCUMENTS

| | | | | |
|---|---|---|---|---|
| 5,257,101 A * | 10/1993 | Lee | ......... | B27B 1/007 348/552 |
| 5,421,385 A * | 6/1995 | McGee | ......... | B27B 1/007 144/133.3 |
| 6,644,164 B1 * | 11/2003 | Stroud | ......... | B27B 1/007 144/357 |
| 2006/0207686 A1 * | 9/2006 | Strebig | ......... | B27B 1/007 144/356 |
| 2014/0208901 A1 * | 7/2014 | Doiel | ......... | B27B 1/007 83/13 |

* cited by examiner

*Primary Examiner* — Sean Shechtman
(74) *Attorney, Agent, or Firm* — Rylander & Associates, PC; Philip R. M. Hunt (57) ABSTRACT

A system and a method for optimizing a rotational orientation of a cylindrical workpiece for a shaping process. The system having a first scanner configured to perform a first scan of the workpiece. A processor configured to perform a first optimization using data from the first scan to determine a first amount of rotation. A turning mechanism configured to perform a first rotation of the workpiece. A second scanner configured to perform a second scan of the workpiece after the first rotation. The processor further configured to determine a second actual rotational orientation of the workpiece using the data from first scan and data from the second scan, to perform a second optimization using the data from first scan to determine a second amount of rotation. The turning mechanism further configured to perform a second rotation of the workpiece by the second amount of rotation.

12 Claims, 7 Drawing Sheets

SYSTEM AND METHOD FOR DOUBLE ROTATION OPTIMIZATION

CROSS-REFERENCE TO RELATED APPLICATION

The present application claims the benefit of, and priority to, U.S. Provisional Application No. 61/825,371 filed on 20 May 2013, incorporated herein by reference.

FIELD OF THE INVENTION

The present invention relates to handling of cylindrical workpieces in manufacturing processes. More particularly, the present invention relates to scanning a workpiece and rotating it to a position optimized for processing.

BACKGROUND

Some industrial processes require handling of large cylindrical workpieces. For example, lumber mills must handle logs and position them for being cut by a saw. Positioning the log for cutting involves moving the log towards the saw and rotating the log into an optimal rotational orientation. The optimal rotational orientation of a log for cutting is that orientation that will obtain the highest yields of the most desired cuts of lumber. To find the optimal rotation orientation, a laser scanner scans the surface of the log and generates scan data. A processor then takes the scan data and constructs a three dimensional model of the log. The same processor or a different processor can then run an algorithm on the three dimensional model of the log to determine a set of optimal cuts to make and the optimal orientation for the log to be in for the saw to make the set of optimal cuts. The optimal cuts and optimal orientation may not be the ultimately best solution, but may be the best found by the algorithm according to a set of process criteria.

Boyd (U.S. Pat. No. 7,857,021) describes one such system and method for positioning a workpiece in an optimized position. A marking device places a mark on the workpiece prior to the workpiece passing through a scanner. Boyd teaches a spray paint line placed on an end of the workpiece, making a superficial cut or identifying a natural feature of the workpiece. The mark is used as a point of reference while rotating the workpiece relative to the orientation of the mark. The workpiece is then scanned. Using the resulting scanning data, an optimizer processor determines the optimal rotational orientation of the workpiece for processing. An initial orientation of the workpiece is identified by a first camera. A turning mechanism rotates the workpiece to the optimal rotational orientation. A second camera identifies the orientation of the mark while the workpiece is being rotated. A processor compares in real time the orientation of the workpiece with the optimized position to determine if the workpiece is in the optimized position.

This system and method of Boyd has several flaws. The first flaw is that it requires a mark to be placed on the workpiece. The mark will remain on some of the pieces of the workpiece after it is cut. In most cases, this mark is undesirable on the finished pieces and removing it will be impractical or at least an added expense. The second flaw of the method of Boyd is insufficient accuracy. Depending on the method of making the mark, the mark may not have very sharply defined edges. This will impair the accuracy of tracking the rotational orientation of the workpiece. A third flaw of the method of Boyd is that the time it takes to perform the optimization algorithm. If a detailed optimization is performed, it may delay the processing of the workpiece, decreasing the productivity of the lumber mill. A crude optimization would be quicker and avoid delay, but better optimization solutions may be missed, resulting in needless waste and loss of value in the product cut from the workpiece.

What is needed is a method for more accurately optimizing the rotational orientation of a workpiece without marking the workpiece and minimizing delay in calculating the optimized orientation.

BRIEF DESCRIPTION OF THE DRAWINGS

The present invention will be described by way of exemplary embodiments, but not limitations, illustrated in the accompanying drawings in which like references denote similar elements.

The accompanying drawings, which are incorporated into and constitute a part of this specification, illustrate one or more embodiments of the invention and, together with the detailed description, serve to explain the principles and implementations of the invention.

DETAILED DESCRIPTION

Before beginning a detailed description of the subject invention, mention of the following is in order. When appropriate, like reference materials and characters are used to designate identical, corresponding, or similar components in different figures. The figures associated with this disclosure typically are not drawn with dimensional accuracy to scale, i.e., such drawings have been drafted with a focus on clarity of viewing and understanding rather than dimensional accuracy.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Use of directional terms such as "upper," "lower," "above," "below", "in front of," "behind," etc. are intended to describe the positions and/or orientations of various components of the invention relative to one another as shown in the various Figures and are not intended to impose limitations on any position and/or orientation of any embodiment of the invention relative to any reference point external to the reference.

Figure 8:
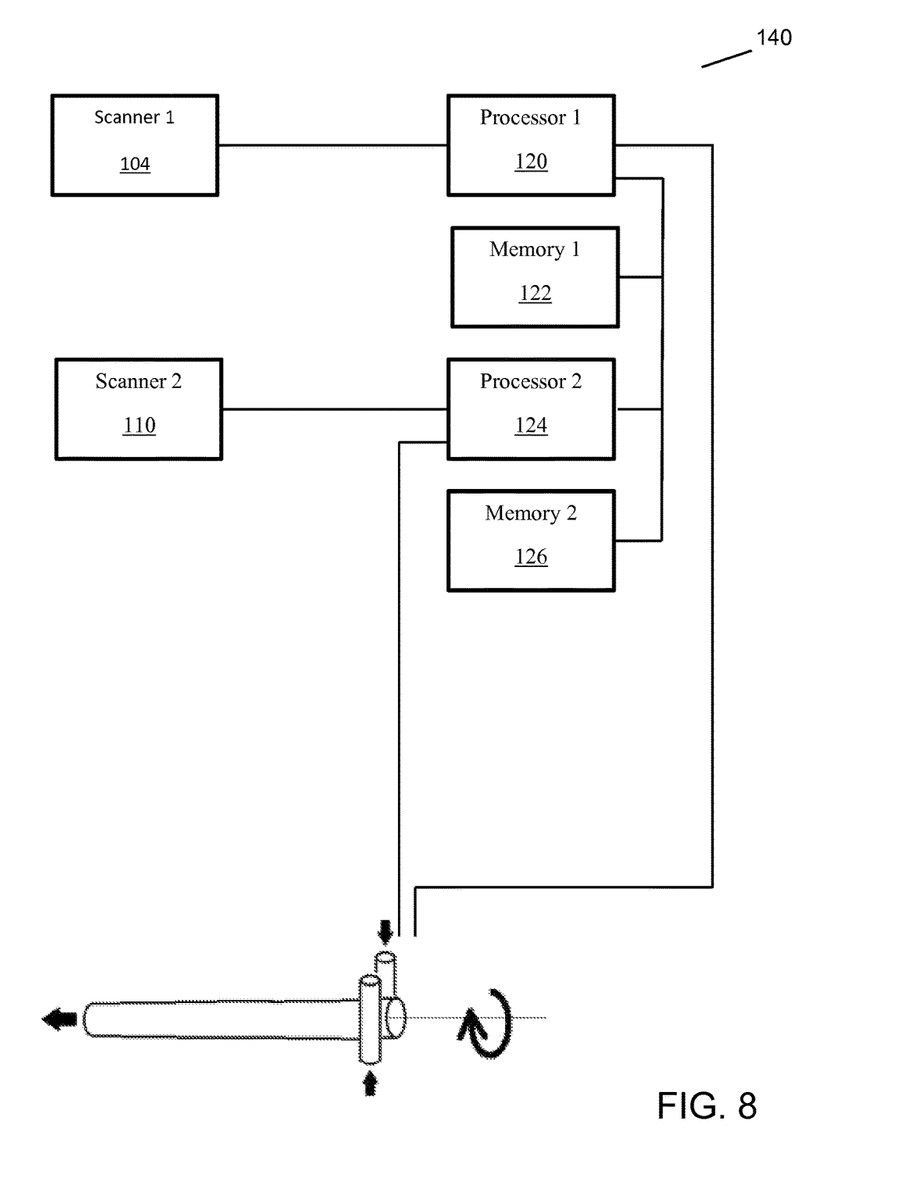
FIG. 8 is a schematic view of a second embodiment workpiece optimization system for optimizing rotational orientation of a cylindrical workpiece with two scanners and two processors.
Figure 9:
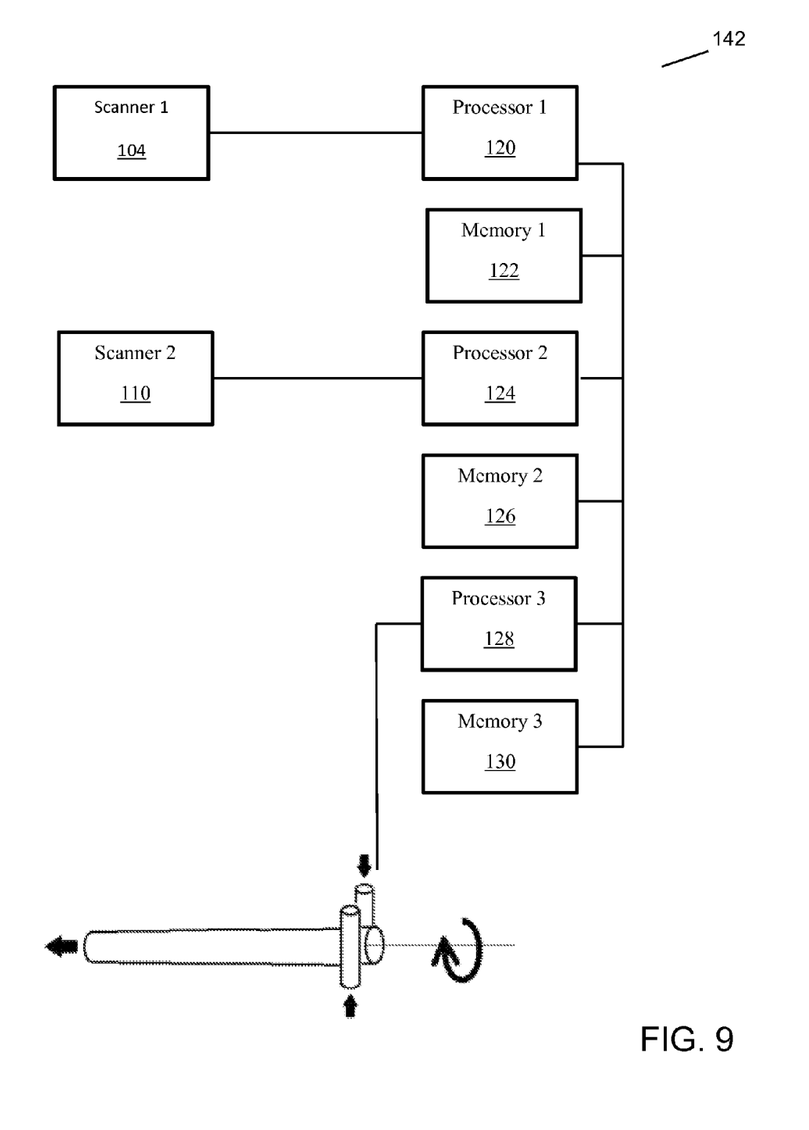
FIG. 9 is a schematic view of a third embodiment workpiece optimization system for optimizing rotational orientation of a cylindrical workpiece with two scanners and three processors.
Figure 10:
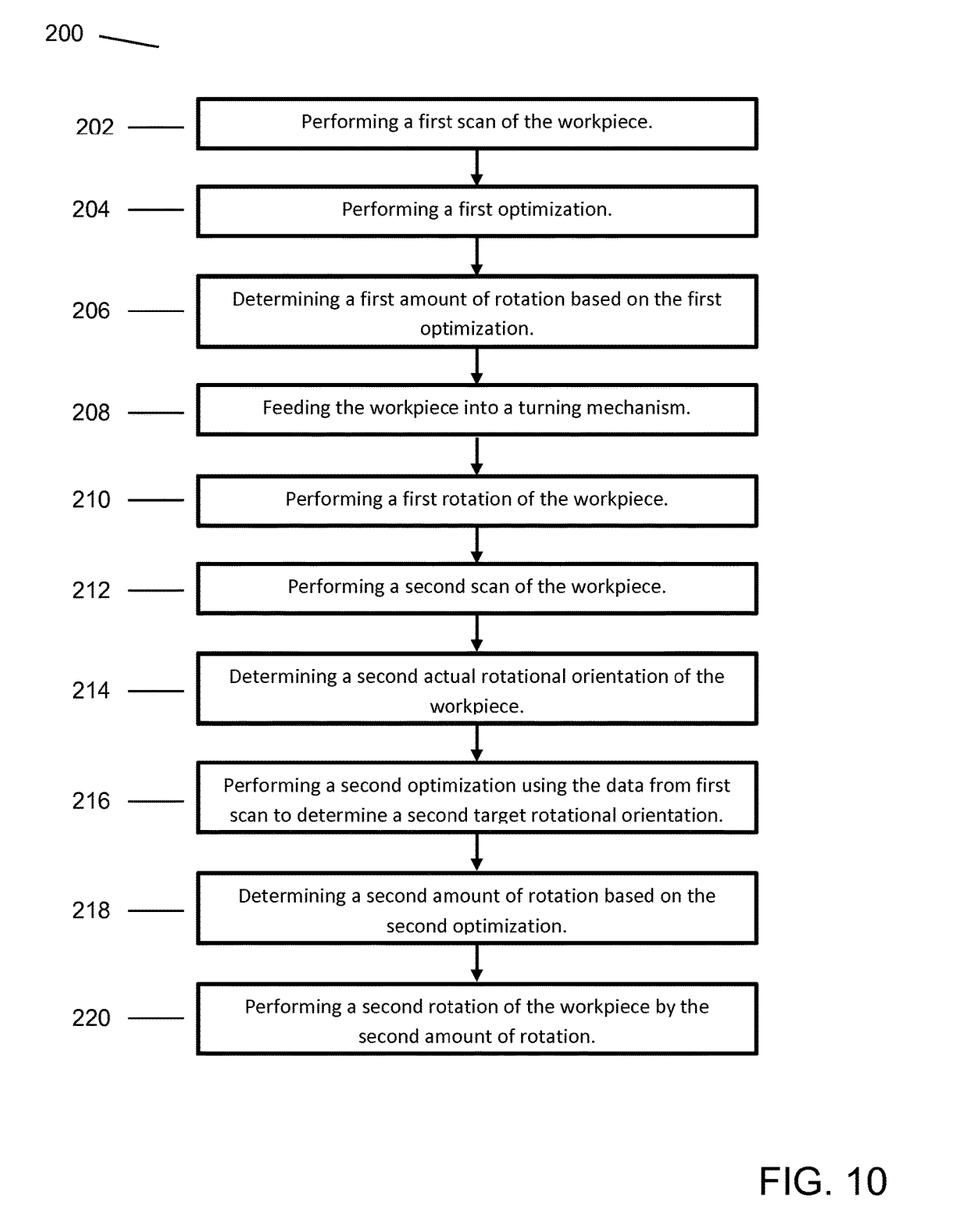
FIG. 10 is a flow chart of the first embodiment method.

FIGS. 1-7 illustrate a first embodiment of a workpiece optimization system 100 performing a first embodiment method 200 for optimization a rotational orientation of a cylindrical workpiece 102. FIG. 8 illustrates a second embodiment workpiece optimization system 140 and FIG. 9 illustrates a third embodiment workpiece optimization system 142. FIG. 10 is a flow chart of the first embodiment method 200.

Figure 1:
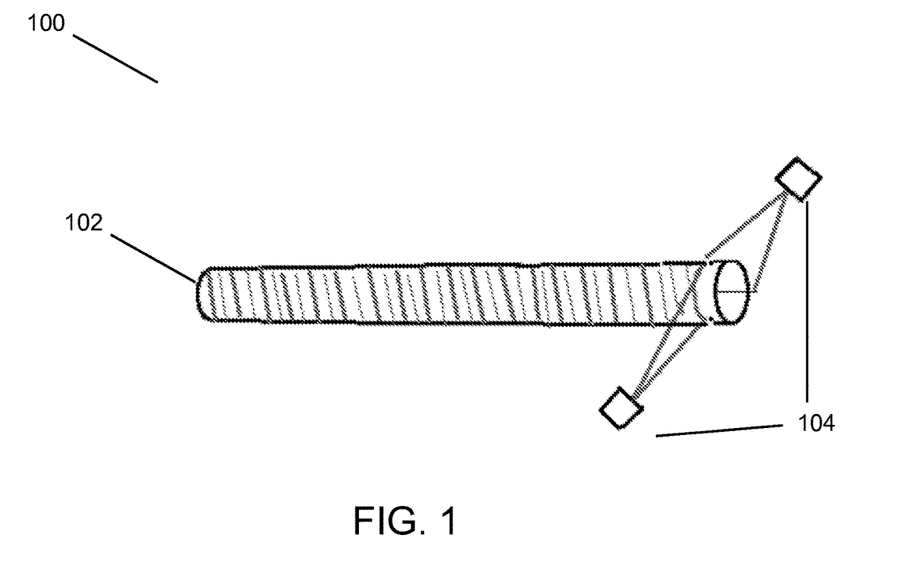
FIG. 1 illustrates a first embodiment workpiece optimization system performing a first scan of the workpiece.

FIG. 1 illustrates the first embodiment workpiece optimization system 100 performing a first step 202 of the first embodiment method 200 for optimizing a rotational orientation of the cylindrical workpiece 102. The first step 202 includes performing a first scan of the workpiece 102 while the workpiece 102 is in a first actual rotational orientation. In the first embodiment method 200, the workpiece 102 is moved longitudinally for its full length through a first scanner 104. The first scanner 104 collects a first set of scan data of workpiece 102. The workpiece 102 is transported on a moving conveyor chain (not shown) built with metal "flytes" that cradle the workpiece 102. This arrangement minimizes rotational movement of the workpiece 102 as it moves on the conveyor. However, in other embodiments, the workpiece 102 may be stationary while the first scanner 104 moves to perform the first scan of the workpiece 102.

A second step 204 includes performing a first optimization using data from the first scan to determine a first target rotational orientation. In some embodiments, this includes creating a first model of the workpiece 102 using the data from the first scan. A first plurality of possible rotational orientations of the first model is evaluated against process optimization criteria. The one of the first plurality of possible rotational orientations that best meets the process optimization criteria is set as the first rotational orientation target.

A third step 206 includes determining a first amount of rotation based on the first optimization. The first amount of rotation is an amount of rotation that will rotate the workpiece 102 from the first actual rotational orientation to the first target rotational orientation.

Figure 2:
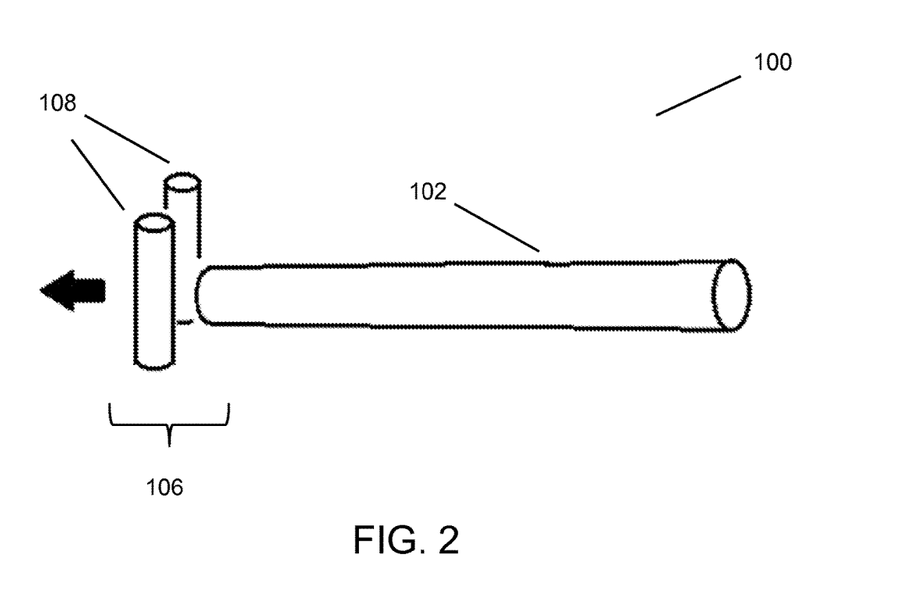
FIG. 2 illustrates the first embodiment workpiece optimization system feeding a leading end of the workpiece into a turning mechanism.

FIG. 2 illustrates the first embodiment workpiece optimization system 100 performing a fourth step 208 of feeding a leading end of the workpiece 102 into a turning mechanism 106. In the first embodiment method 200, the turning mechanism 106 is a set of at least two vertical turning rolls 108. The turnings rolls close on to the workpiece 102 and take control of its rotational orientation. In other embodiments, the turning mechanism 106 may be different, such as horizontal turning rolls.

Figure 3:
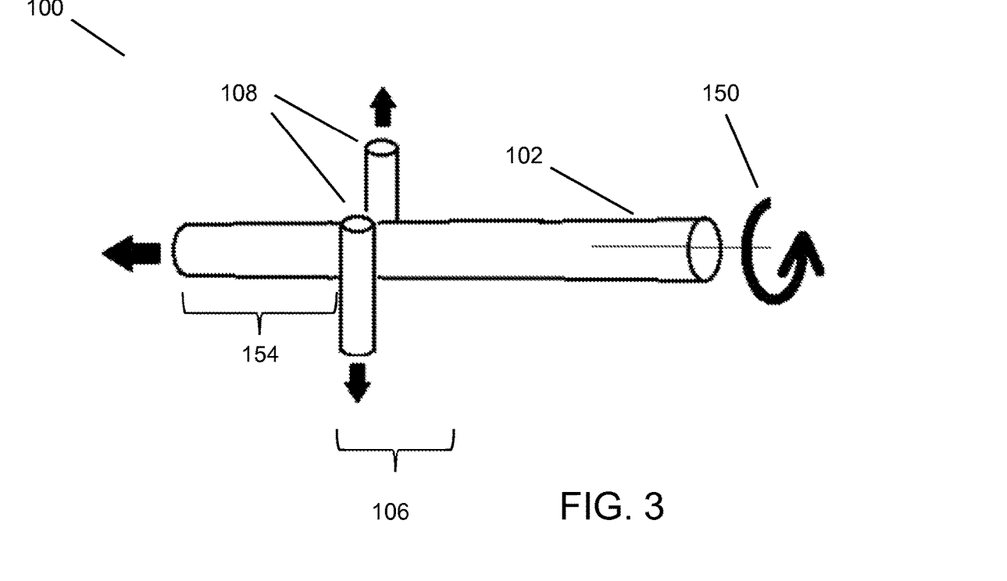
FIG. 3 illustrates the first embodiment workpiece optimization system performing a first rotation of the workpiece by the first amount of rotation.

FIG. 3 illustrates the first embodiment workpiece optimization system 100 performing a fifth step 210 that includes performing a first rotation of the workpiece 102 by the first amount of rotation. In the first embodiment method 200, as a first workpiece portion 154, short portion of the total length of the workpiece 102, moves longitudinally past the set of turning rolls 108, a first rotation is performed on the workpiece 102 in which one roll raises, the other roll lowers by distances calculated to cause the workpiece 102 to rotate to by the first amount of rotation 150.

Figure 4:
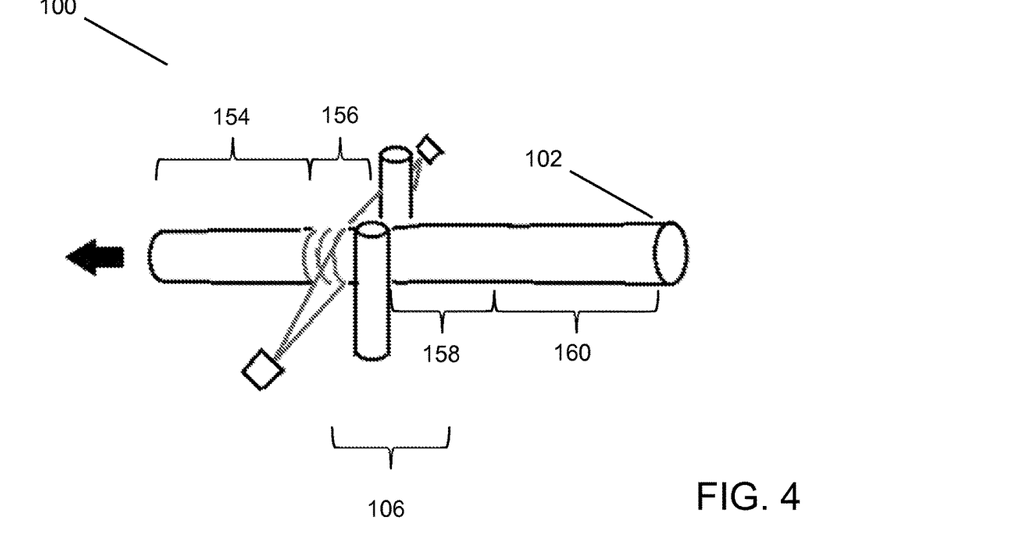
FIG. 4 illustrates the first embodiment workpiece optimization system performing a second scan of the workpiece after the first rotation.

FIG. 4 illustrates the first embodiment workpiece optimization system 100 performing a sixth step 212 that includes performing a second scan of the workpiece 102 after the first rotation. In the first embodiment method 200 method 200, rotation of the workpiece 102 is stopped and a second scanner 110 collects a second set of scan data. This second set of scan data is taken only of a second workpiece portion 156, a short portion of the total length of the workpiece 102, as the workpiece 102 continues moving longitudinally through the set of turning rolls 108. The second scan is done in between two portions of the workpiece 102 reserved for rotation (i.e., the first workpiece portion 154 and a fourth workpiece portion 160) because the scanning will not be accurate if the workpiece 102 is rotating during the scanning. The second scan covers a smaller portion of the longitudinal length of the workpiece 102 than is covered by the first scan. In some embodiments, the second scan is performed by scanning less than 33% but more than 10% of the longitudinal length of the workpiece 102. The length of the second workpiece portion 156, and hence, the length of the second scan may be limited by the fourth workpiece portion 160 that is reserved for the second rotation and by a third workpiece portion 158 that is reserved for the second optimization and calculation of the second rotation. The fourth workpiece portion 160 reserved for the second rotation may be longer for larger diameter logs. The length required for second rotation will be a larger percentage of the log length for shorter logs. The percentage of length for the second scan will be shorter as the length for the second rotation becomes longer.

Figure 5:
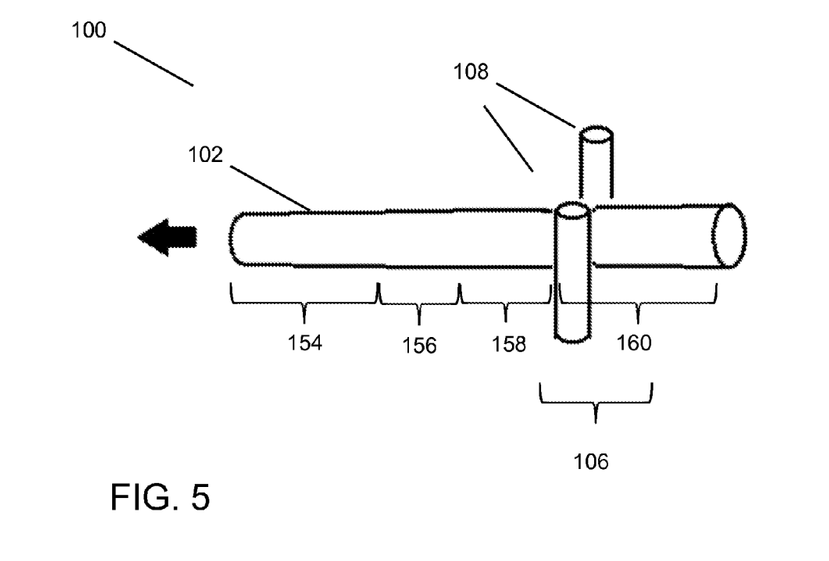
FIG. 5 illustrates the workpiece passing through the turning mechanism while steps of the second optimization are performed.

As shown in FIG. 5, the workpiece 102 continues to move through the turning mechanism 106. A seventh step 216 includes performing a second optimization using the data from first scan to determine a second target rotational orientation. This step also includes determining a second actual rotational orientation of the workpiece 102 using the data from first scan and data from the second scan.

An eighth step 218 includes determining a second amount of rotation 152, which is an amount of rotation that will rotate the workpiece 102 from the second actual rotational orientation to the second target rotational orientation. In the first embodiment method 200, determining the second actual rotational orientation of the workpiece 102 includes creating a second model of the workpiece 102 using the data from the second scan, then rotating the first model and/or the second model until a portion of the first model matches or substantially matches a portion of the second model. The second actual rotation orientation of the workpiece 102 is then determined based on the amounts the models were rotated to obtain a match.

In the first embodiment method 200, performing the second optimization includes evaluating a second plurality of possible rotational orientations of the first model against the process optimization criteria. The one of the first plurality and second plurality of possible rotational orientations of the first model that bests meets the process optimization criteria is set as the second rotational orientation target. In some embodiments, the second optimization includes evaluating a plurality of possible rotational orientations of the second model against the process optimization criteria.

As FIG. 5 illustrates, the seventh step 216 and eighth step 218 are performed as the third portion 158 of the workpiece 102 passes through the turning mechanism 106. The search for the second optimization is stopped while sufficient length of the workpiece 102 remains ahead of the workpiece 102 turning rolls 108 to allow sufficient time to calculate the second target rotational orientation, the second amount of rotation and to effect the second rotation.

This second optimization provides an opportunity to find a rotation solution that is superior to the first optimized rotation solution found. For example, the first optimization may only evaluate a small portion of the all the possible rotation orientations, due to time and resource constraints. The second optimization allows evaluation of more of the possible rotation orientations. In the first embodiment method 200, the second optimization evaluates possible rotational orientations that are nearer the first target rotational orientation before those that are farther. This assumes that the first optimization has found a fairly good solution for processing the workpiece 102 and any better solutions are likely to be close to the one found in the first optimization. However, in other embodiments, the second optimization may follow a different pattern in evaluating possible rotational orientations.

Figure 6:
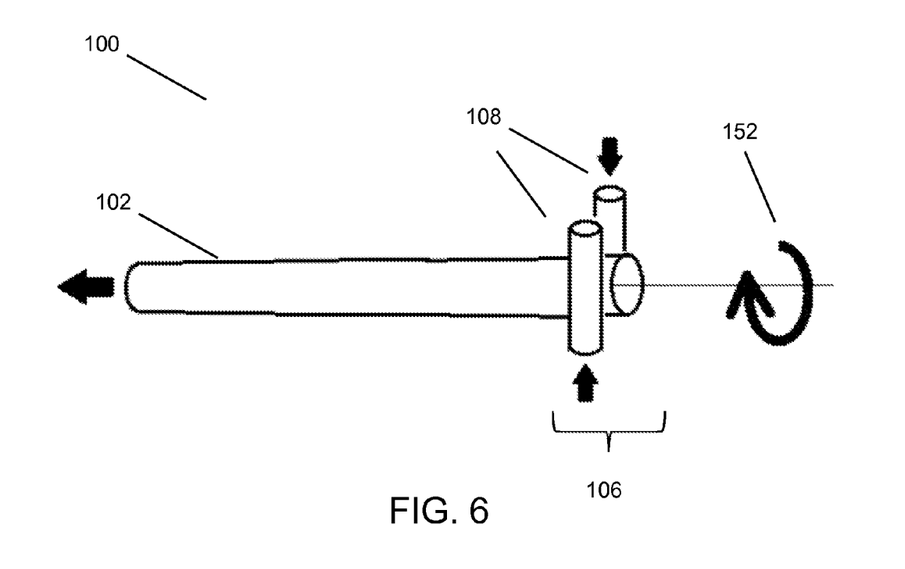
FIG. 6 illustrates the first embodiment workpiece optimization system performing a second rotation of the workpiece by the second amount of rotation.

FIG. 6 illustrates the first embodiment workpiece optimization system 100 performing a ninth step 220 that includes performing a second rotation of the workpiece 102 by the second amount of rotation 152. In the first embodiment method 200, the turning rolls 108 are commanded to rotate the workpiece 102 a second time to achieve the second optimized rotation orientation target as the fourth portion 160 of the workpiece 102 moves through the turning rolls 108.

Figure 7:
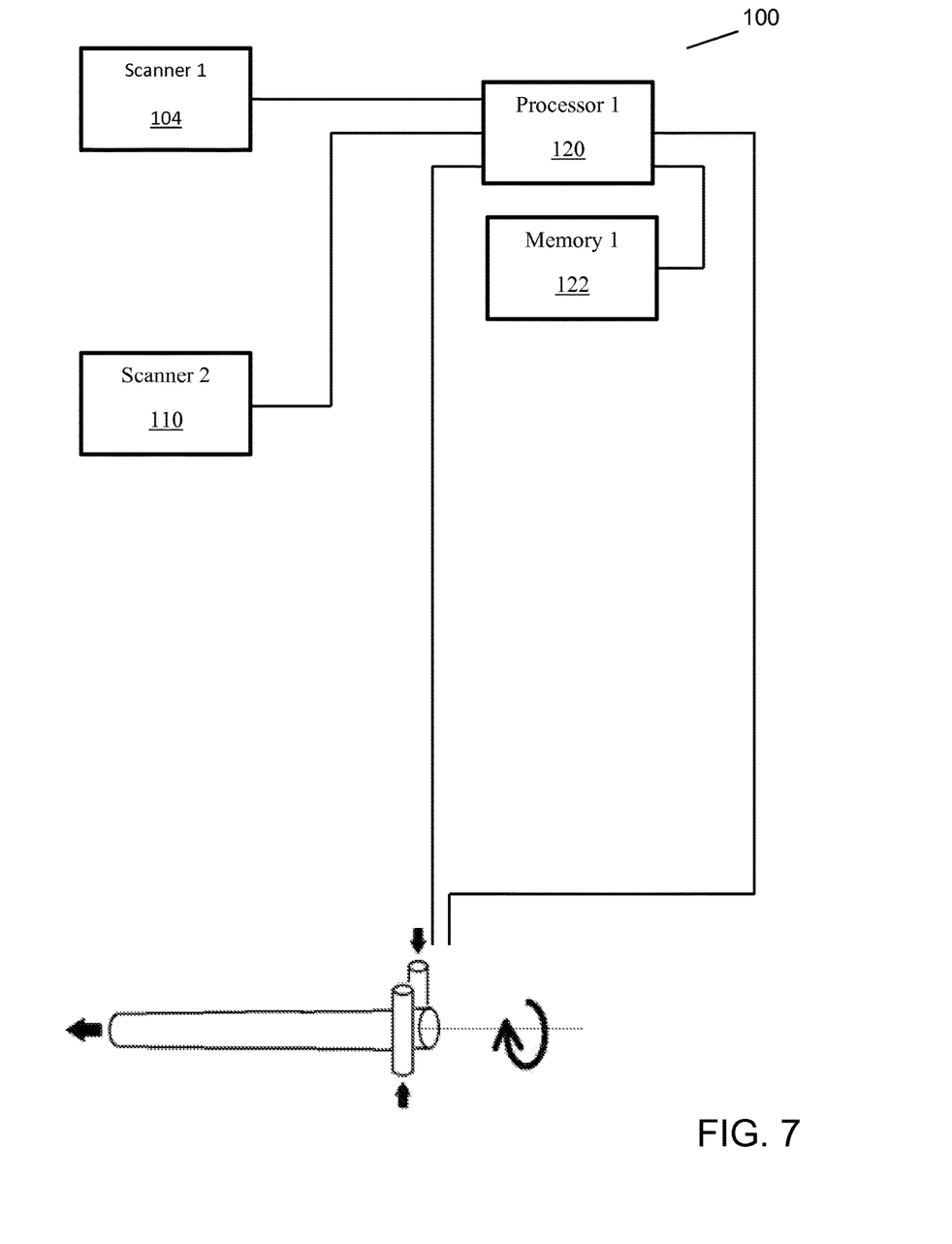
FIG. 7 is a schematic view of the first embodiment of the workpiece optimization system.

FIG. 7 is a schematic view of the first embodiment of the workpiece optimization system 100. The first embodiment workpiece optimization system 100 comprises the first scanner 104, the second scanner 110, the turning mechanism 106 and a first processor 120. In this embodiment, all the processing of the scanning data from the first scanner 104 and second scanner 110 is done in this first processor 120. This is a less expensive approach than using additional processors, but a single processor will not be able to evaluate as many possible rotational orientations for optimization since it is handling other tasks in addition to optimization. The first processor 120 has a first memory 122 associated to store instructions, scan data and the models of the workpiece 102.

FIG. 8 is a schematic view of a second embodiment workpiece optimization system 140 for optimizing rotational orientation of a cylindrical workpiece 102 with two scanners and two processors. In this embodiment, the first processor 120 creates the first model based on data from the first scanner 104 and a second processor 124 creates the second model based on data from the second scanner 110. The first processor 120 performs the first optimization and the second processor 124 performs the second optimization. This allows the first processor 120 to begin working on scan data for a following workpiece after it has completed the first optimization of the current workpiece 102. Each processor has its own associated memory that it uses to store data and/or instructions. The first processor 120 has the first memory 122 associated with it and the second processor 124 has a second memory 126 associated with it. When the first optimization is completed, the first data model is transferred to the second memory 126.

FIG. 9 is a schematic view of a third embodiment workpiece optimization system 142 for optimizing rotational orientation of a cylindrical workpiece 102 with two scanners and three processors. In this embodiment, the first processor 120 creates the first model based on data from the first scanner 104, the second processor 124 creates the second model in the second memory 126 based on data from the second scanner 110 and a third processor 128 performs the first optimization and the second optimization. This allows the first processor 120 and second processor 124 to process scan data and create the models while the third processor 128 performs optimizations and sends instructions to the turning mechanism 106. Each processor has its own associated memory that it uses to store data and/or instructions. The first processor 120 creates the first data model in the first memory 122, then the first data model is transferred to a third memory 130 associated with the third processor 128.

Those skilled in the art will recognize that numerous modifications and changes may be made to the embodiment described herein without departing from the scope of the claimed invention. It will, of course, be understood that modifications of the invention, in its various aspects, will be apparent to those skilled in the art, some being apparent only after study, others being matters of routine mechanical, chemical and electronic design. No single feature, function or property of the any embodiment is essential. Other embodiments are possible, their specific designs depending upon the particular application. As such, the scope of the invention should not be limited by the particular embodiments herein described but should be defined only by the appended claims and equivalents thereof.

I claim:

1. A method for optimizing a rotational orientation of a workpiece for a shaping process, the workpiece with a generally cylindrical shape and a longitudinal length, comprising the steps of:
   performing a first scan of the workpiece while the workpiece is in a first actual rotational orientation;
   performing a first optimization using data from the first scan to determine a first target rotational orientation, including creating a first model of the workpiece using the data from the first scan;
   determining a first amount of rotation based on the first optimization, wherein the first amount of rotation is an amount of rotation that will rotate the workpiece from the first actual rotational orientation to the first target rotational orientation;
   performing a first rotation of the workpiece by the first amount of rotation;
   performing a second scan of the workpiece after the first rotation;
   determining a second actual rotational orientation of the workpiece using the data from first scan and data from the second scan, including creating a second model of the workpiece using the data from the second scan, and rotating at least one of the first model and second model until a portion of the first model matches a portion of the second model;
   performing a second optimization using the data from first scan to determine a second target rotational orientation;
   determining a second amount of rotation based on the second optimization, wherein the second amount of rotation is an amount of rotation that will rotate the workpiece from the second actual rotational orientation to the second target rotational orientation; and
   performing a second rotation of the workpiece by the second amount of rotation.

2. The method of claim 1, wherein performing the first optimization further comprises:

evaluating a first plurality of possible rotational orientations of the first model against process optimization criteria; and setting the first rotational orientation target as one of the first plurality of possible rotational orientations of the first model that bests meets the process optimization criteria.

3. The method of claim 2, wherein performing the second optimization further comprises:

evaluating a second plurality of possible rotational orientations of the first model against the process optimization criteria; and setting the second rotational orientation target as one of the first plurality and second plurality of possible rotational orientations of the first model that bests meets the process optimization criteria.

4. The method of claim 3, wherein evaluating the second plurality of possible rotational orientations of the first model against the process optimization criteria further comprises:

evaluating possible rotational orientations that are nearer the first target rotational orientation before those that are farther.

5. The method of claim 1, wherein:

the first scan covers a greater portion of the longitudinal length of the workpiece than is covered by the second scan.

6. The method of claim 1, wherein:

the second scan of the workpiece is performed by scanning less than 33% but more than 10% of the longitudinal length of the workpiece.

7. The method of claim 1, wherein:

the first optimization is performed by a first processor; and the second optimization is performed by a second processor.

8. A system for optimizing a rotational orientation of a workpiece for a shaping process, the workpiece with a generally cylindrical shape and a longitudinal length, comprising:

a first scanner configured to perform a first scan of the workpiece while the workpiece is in a first actual rotational orientation;

a processor configured to perform a first optimization using data from the first scan to determine a first target rotational orientation, including creating a first model of the workpiece using the data from the first scan;

the processor further configured to determine a first amount of rotation;

a turning mechanism configured to perform a first rotation of the workpiece by the first amount of rotation;

a second scanner configured to perform a second scan of the workpiece after the first rotation;

the processor further configured to determine a second actual rotational orientation of the workpiece using the data from first scan and data from the second scan, including creating a second model of the workpiece using the data from the second scan, and rotating at least one of the first model and second model until a portion of the first model matches a portion of the second model;

the processor further configured to perform a second optimization using the data from first scan to determine a second target rotational orientation;

the processor further configured determine a second amount of rotation; and the turning mechanism further configured to perform a second rotation of the workpiece by the second amount of rotation.

9. A system for optimizing a rotational orientation of a workpiece for a shaping process, the workpiece with a generally cylindrical shape and a longitudinal length, comprising:

a first scanner configured to perform a first scan of the workpiece while the workpiece is in a first actual rotational orientation;

a first processor configured to perform a first optimization using data from the first scan to determine a first target rotational orientation, including creating a first model of the workpiece using the data from the first scan;

the first processor further configured to determine a first amount of rotation;

a turning mechanism configured to perform a first rotation of the workpiece by the first amount of rotation;

a second scanner configured to perform a second scan of the workpiece after the first rotation;

a second processor configured to determine a second actual rotational orientation of the workpiece using the data from first scan and data from the second scan, including creating a second model of the workpiece using the data from the second scan, and rotating at least one of the first model and second model until a portion of the first model matches a portion of the second model;

the second processor further configured to perform a second optimization using the data from first scan to determine a second target rotational orientation;

the second processor further configured determine a second amount of rotation, an amount of rotation that will rotate the workpiece from the second actual rotational orientation to the second target rotational orientation; and the turning mechanism further configured to perform a second rotation of the workpiece by the second amount of rotation.

10. A system for optimizing a rotational orientation of a workpiece for a shaping process, the workpiece with a generally cylindrical shape and a longitudinal length, comprising:

a first scanner configured to perform a first scan of the workpiece while the workpiece is in a first actual rotational orientation;

a first processor configured to create a first model based on data from the first scan;

a third processor configured to perform a first optimization using data from the first scan to determine a first target rotational orientation;

the third processor further configured to determine a first amount of rotation;

a turning mechanism configured to perform a first rotation of the workpiece by the first amount of rotation;

a second scanner configured to perform a second scan of the workpiece after the first rotation;

a second processor configured to create a second model based on data from the second scan;

the third processor further configured to determine a second actual rotational orientation of the workpiece using the data from first scan and data from the second scan;

the third processor further configured to perform a second optimization using the data from first scan to determine a second target rotational orientation;

the third processor further configured determine a second amount of rotation; and the turning mechanism further configured to perform a second rotation of the workpiece by the second amount of rotation.

11. The system of claim 10, wherein the third processor configured for performing the first optimization further comprises the third processor configured for creating a first model of the workpiece using the data from the first scan.

12. The system of claim 11, wherein the third processor configured for determining the second actual rotational orientation of the workpiece further comprises the third processor configured for:

creating a second model of the workpiece using the data from the second scan; and rotating at least one of the first model and second model until a portion of the first model matches a portion of the second model.

* * * * *